(12) United States Patent
Lowry

(10) Patent No.: US 6,457,506 B1
(45) Date of Patent: Oct. 1, 2002

(54) DECAPSULATING METHOD AND APPARATUS FOR INTEGRATED CIRCUIT PACKAGES

(75) Inventor: Robert K. Lowry, Melbourne Beach, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/430,391

(22) Filed: Oct. 29, 1999

Related U.S. Application Data

(62) Division of application No. 09/106,622, filed on Jun. 29, 1998, now Pat. No. 6,054,012.

(51) Int. Cl.$^7$ ............................................... B32B 35/00
(52) U.S. Cl. ........................ 156/584; 156/344; 219/678; 219/756; 29/426.4; 29/426.5; 29/762
(58) Field of Search ................................ 156/344, 584; 29/402.06, 426.1, 426.3, 426.4, 426.5, 426.6, 564.3, 762; 219/678, 756

(56) References Cited

U.S. PATENT DOCUMENTS

| | | | |
|---|---|---|---|
| 4,281,031 A | * 7/1981 | Hillman et al. | 427/314 X |
| 4,344,809 A | 8/1982 | Websink | 156/345 |
| 4,359,360 A | 11/1982 | Harris et al. | 156/345 |
| 4,826,556 A | 5/1989 | Kobayashi | 156/345 |
| 5,252,179 A | 10/1993 | Ellerson et al. | 156/655 |
| 5,254,237 A | * 10/1993 | Snaper et al. | 204/298.41 |
| 5,271,798 A | 12/1993 | Sandhu et al. | 156/638 |
| 5,321,222 A | * 6/1994 | Bible et al. | 219/745 |
| 5,350,737 A | * 9/1994 | Harada et al. | 427/575 X |
| 5,521,360 A | 5/1996 | Johnson et al. | 219/709 |
| 5,552,112 A | * 9/1996 | Schiffmann et al. | 422/21 |
| 5,648,038 A | * 7/1997 | Fathi et al. | 264/406 |
| 5,766,496 A | 6/1998 | Martin | 216/55 |
| 6,011,249 A | * 1/2000 | Chung | 219/685 |
| 6,211,499 B1 | * 4/2001 | Morrow et al. | 134/38 |

OTHER PUBLICATIONS

"Integrated Circuit Packaging", *Electronics Industry Environmental Roadmap: Integrated Circuit Packaging*, pp. 1–5.
Product Sheet for "Lambda Technologies' MicroCure 2000 Series", Lambda Technologies, one page.
"What is Variable Frequency Mircowave Processing?", Lambda Technologies, pp. 1–2.
Product Sheet for "Lambda Technologies' MicroCure 5100", Lambda Technologies, pp. 1–3.
*Applicaton Note MC98–201*, "MicroCure VFM Rapid Cure Proceedingz; Flip Chip Underfill Cure Dexter FP4527", pp. 1–3.
*Applicaton Note MC98–203*, "MicroCure VFM Rapid Cure Proceeding; Flip Chip Underfill Cure Dexter FP4527", pp. 1–2.
Fathi et al., "Innovative Curing of High Reliability Advanced Polymeric Encapsulante", pp. 1–11.
Anderson et al., "Rapid Processing and Properties Evaluation of Flip–Chip Underfills", pp. 1–9.

* cited by examiner

Primary Examiner—Mark A. Osele
(74) Attorney, Agent, or Firm—Allen, Dyer, Doppelt, Milbrath & Gilchrist, P.A.

(57) ABSTRACT

The decapsulating method is for an integrated circuit package and includes the steps of subjecting the encapsulant to electromagnetic radiation, and, more preferably microwave radiation, to break the polymer bonds of the polymer resin and convert the encapsulant to loosened particles. The loosened particles can then be removed to thereby decapsulate the integrated circuit package. The method may further include the step of maintaining the integrated circuit package below a predetermined temperature during the subjecting step. The step of maintaining the temperature below the predetermined temperature may be performed by controlling a power of the electromagnetic radiation, such as based upon sensing a temperature of the integrated circuit package. The method may further comprise the step of varying a frequency of the microwave radiation during the subjecting step.

6 Claims, 3 Drawing Sheets

DECAPSULATING METHOD AND APPARATUS FOR INTEGRATED CIRCUIT PACKAGES

This application is a division of Ser. No. 09/106,622 filed on Jun. 29, 1998, now U.S. Pat. No. 6,054,012 the disclosure of which is hereby incorporated by reference in its entirety.

FIELD OF THE INVENTION

The present invention relates to the field of semiconductors, and, more particularly, to a method and associated apparatus for removing encapsulant from a device, such as to facilitate failure testing of the device.

BACKGROUND OF THE INVENTION

Semiconductor devices in the form of integrated circuits are used in virtually all electronic devices. A typical integrated circuit includes a die formed of silicon with transistors and other active and passive devices formed on the silicon. The integrated circuit die is typically included in an integrated circuit package. The package typically provides for the die: electrical interconnection, mechanical support, heat dissipation, and protection.

Most integrated circuit packages include a leadframe which carries the external connection pins, wire bonds between the leadframe and the die, and an encapsulant. The encapsulant is typically a plastic which is molded around the other components and cured during manufacturing to thereby protect the encapsulated components from the ambient environment. Ceramics are used in some applications as the encapsulating material, but are more expensive and require higher energy processing as compared to plastics.

Thermosetting epoxy materials are typically used for plastic packages. These materials are typically made with fused silica as a filler, such as greater than 60% by weight. The epoxy may include cresylic novolac resin and phenolic novolac resin as the hardener. In addition, a flame retardant, such as antimony trioxide or bromine is included. The thermosetting epoxy is permanently cured, typically by the application of heat, during the molding process.

It is often desirable to non-destructively access the integrated circuit die after the packaging has been completed. For example, if device testing indicates that the integrated circuit is defective, it is often desirable to perform an analysis to determine what caused the failure. The results of the failure analysis may be useful to change one or more manufacturing techniques to thereby reduce the number of future defects.

Unfortunately, removal of the encapsulant material from the integrated circuit is not a simple process. The thermosetting encapsulants typically used will not simply reflow upon the application of heat thereby exposing the underlying leadframe, bond wires and circuit die. It is typically important for subsequent testing that the die and bonding system not be destroyed, and that electrical connections can be established to facilitate electrical performance testing.

One conventional approach to removing the encapsulant or "decapsulating" an integrated circuit etches the encapsulant by applying concentrated acids, such as fuming nitric and fuming sulphuric acid or certain organic solvents, to the encapsulant. There are, of course difficulties with controlling the desired amount of etching, preventing damage to the interior metal components, and removing debris during the etching. Some of these difficulties are addressed, for example, in U.S. Pat. No. 5,766,496 to Martin which discloses an apparatus and associated method using an acid etch and wherein a first syringe pump pumps etchant into an etch head, and a second syringe pump agitates the first quantity of etching repeatedly into and out of an etched cavity. The etch head also includes a heater to heat the volume of etchant prior to its introduction against the encapsulant. Unfortunately, the apparatus and method still rely on the precise delivery and control of acid etchants.

U.S. Pat. No. 4,344,809 to Wensink discloses a jet etch apparatus for decapsulating the molded resin material from an integrated circuit device. The apparatus includes a jet pump or aspirator connected by a tube to an etching block. The etching block is further connected by a tube to a container for holding an etchant solution. The integrated circuit is placed on top of the etching block and as fluid flows through the jet pump, a suction is created drawing etching solution through the etching block and a hole is etched in the encapsulating material. The etchant solution is fuming sulphuric acid. U.S. Pat. No. 4,359,360 also discloses an approach using a heated etchant solution to jet etch the encapsulating material from an integrated circuit. Along these lines, U.S. Pat. No. 4,826,556 further includes a shield for shielding the integrated circuit from outside air to maintain pressure of the etchant fed by an etchant feed pump.

The hot acid etching decapsulating techniques may take from several minutes up to hours to remove the encapsulant. The acid etchant materials raise handling and disposal concerns. Controllability of the etching is also difficult and may result in destruction of the upper surface portions of the die and/or the bond pads. In addition, any ionic contamination at the surface of the die, as may be the cause of certain failures, would be typically be removed during acid etching.

Yet another conventional decapsulating technique includes exposing the integrated circuit to an oxygen plasma. Unfortunately, this approach may take several hours or even several days. In addition, the oxygen plasma etching equipment is relatively expensive.

SUMMARY OF THE INVENTION

In view of the foregoing background, it is therefore an object of the present invention to provide a method and apparatus for decapsulating an integrated circuit, such as to facilitate testing, for example, which is quick and which preserves the integrity of the underlying components.

This and other objects, features and advantages in accordance with the present invention are provided by a method for decapsulating an integrated circuit package by subjecting the encapsulant to electromagnetic radiation, and, more preferably microwave radiation, to break the polymer bonds of the polymer resin and convert the encapsulant to loosened particles. The loosened particles can then be removed to thereby decapsulate the integrated circuit package. The method may further include the step of maintaining the integrated circuit package below a predetermined temperature during the subjecting step. The step of maintaining the temperature below the predetermined temperature may be performed by controlling a power of the electromagnetic radiation, such as based upon sensing a temperature of the integrated circuit package. Since an integrated circuit package will typically include an integrated circuit die having one or more metal layers, the predetermined temperature is preferably below a melting temperature of the metal. It may also be desired to maintain a lower predetermined temperature less than about 350° C.

To ensure uniform irradiation of the encapsulant, the method may further comprise the step of varying a frequency of the microwave radiation during the subjecting step. For example, the step of varying the frequency may comprise varying the frequency over a range of about 5 GHz to 8 GHz. Varying the frequency may also avoid damage from electrostatic fields.

The method may also include the step of positioning the integrated circuit within a shielded chamber during the subjecting step. In addition, the step of subjecting may comprise selectively subjecting a portion of the encapsulant overlying the integrated circuit die to the electromagnetic radiation.

The step of removing may comprise contacting and dislodging the loosened particles. For example, a brush may be used to remove the loosened particles. Alternately, the step of removing may comprise subjecting the loosened particles to a fluid stream, such as a nitrogen gas stream, for example. The loosened particles may also be removed under the influence of gravity.

The step of subjecting the integrated circuit package to microwave radiation is preferably carried out for a predetermined period of time in one variation of the invention. The step of subjecting may also be carried out until a predetermined portion of the encapsulating material has been converted to the loosened particles, as may be determined by observing the encapsulant.

Of course, the decapsulating method may be part of on overall process for studying an integrated circuit die after it has been incorporated into an integrated circuit package. According to this aspect of the invention, the method preferably further includes examining the exposed integrated circuit die after decapsulating the die.

The step of examining may comprise microscopically inspecting the exposed die. The step of examining may also include conducting at least one electrical test on the integrated circuit die, such as using the bond pads on the die which are left intact in accordance with a significant advantage of the present invention. The step of examining may also comprise conducting at least one chemical analysis test for contamination at an outer surface of the integrated circuit die. Again the ionic contamination, if present, remains at the die/encapsulant interface in accordance with another significant advantage of the present invention. Destructive physical analysis, such as including delayering of the die, may also be performed during the examination.

Another aspect of the present invention is directed to an apparatus for decapsulating an integrated circuit package. The apparatus preferably comprises a microwave shielded chamber, a support for supporting the integrated circuit package within the chamber, and a microwave generator coupled to the chamber for generating microwave radiation therein so as to subject the encapsulant of the integrated circuit package to microwave radiation to break polymer bonds in the polymer resin and convert the encapsulant to loosened particles. Moreover, the microwave generator preferably also includes frequency varying means for varying a frequency of the microwave radiation over a predetermined frequency range.

The apparatus may further include temperature control means for maintaining the integrated circuit package below a predetermined temperature while subjected to the microwave radiation. In one embodiment, the temperature control means comprises a temperature sensor and power control means for controlling a power of microwave generator responsive to the temperature sensor. In addition, the apparatus may also include means for removing loosened particles from the integrated circuit package.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
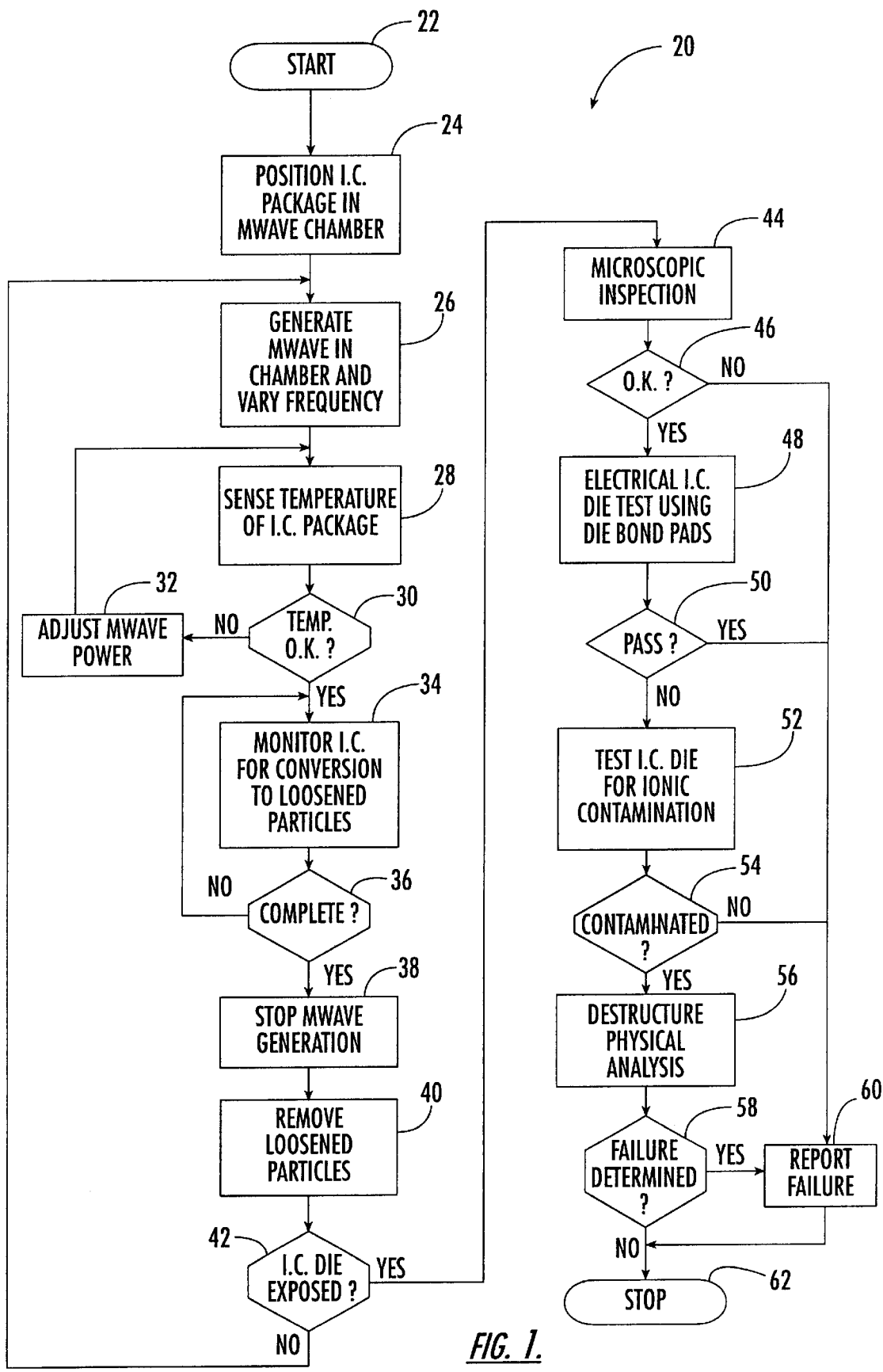
FIG. 1 is a flow chart illustrating the process of decapsulating an integrated circuit package and testing the integrated circuit die in accordance with the present invention.
Figure 2:
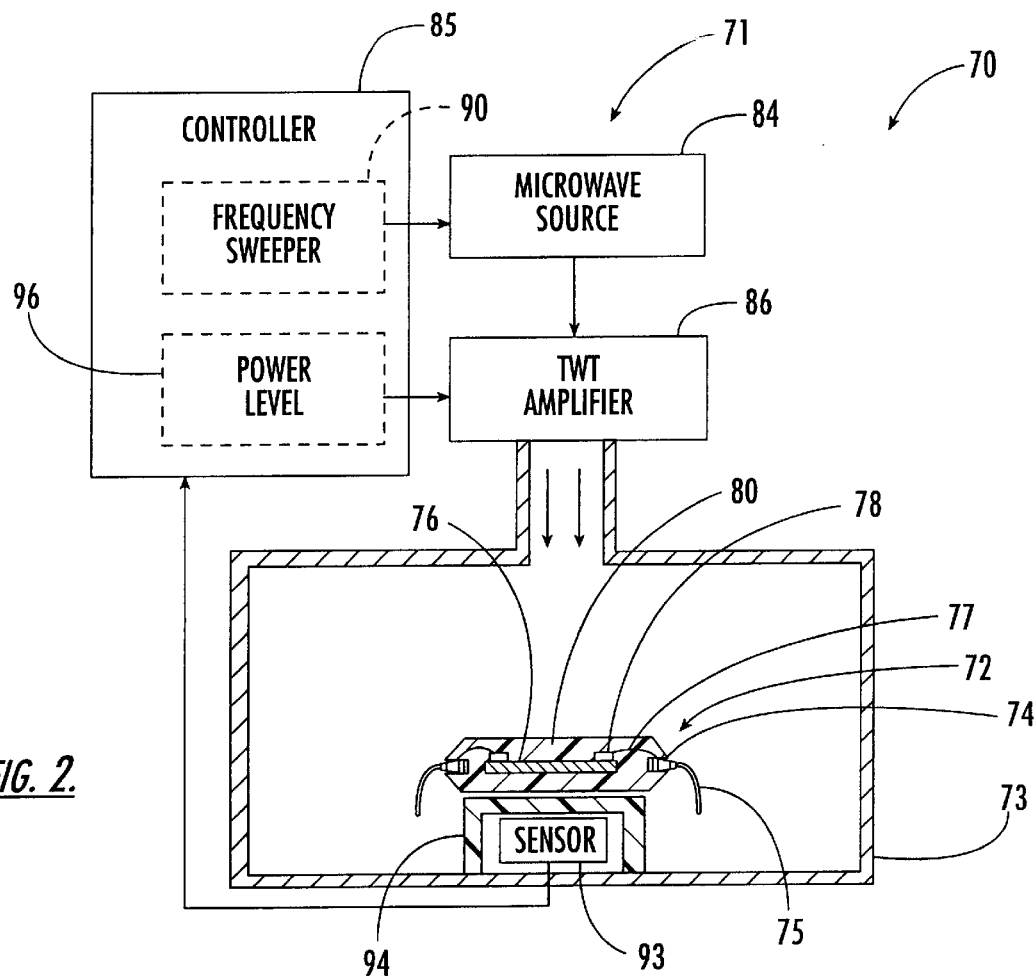
FIG. 2 is a schematic block diagram of an apparatus for decapsulating an integrated circuit package in accordance with the present invention.

Referring initially to the flow chart 20 of FIG. 1, and the block diagram of the apparatus 70 in FIG. 2, the invention is first described. From the start (Block 22), the integrated circuit package 72 is positioned in a microwave shielded chamber 73. The integrated circuit package 72 may include a leadframe 74 carrying the external pins 75, an integrated circuit die 76, and bond wires 77 extending between the leadframe and bond pads 78 on the die, as would be readily appreciated by those skilled in the art.

In addition, the integrated circuit package includes an encapsulant 80 surrounding the other components. The encapsulant 80 is preferably a polymer resin based epoxy which also includes a substantial proportion of filler as described above in the background of the invention. The encapsulant 80 may be a thermosetting encapsulant including a polymer resin.

At Block 26, microwave radiation is generated within the chamber 73. In particular, a microwave signal source 84 is connected to a microwave amplifier, such as the illustrated traveling wave tube (TWT) amplifier 86 which, in turn, is coupled to the chamber 73 as will be readily appreciated by those skilled in the art. The microwave signal source 84 and TWT amplifier 86 are controlled by the controller 85. The controller 85 may include fairly simple logic and signal processing circuitry, or may include a relatively sophisticated microprocessor based circuit. As illustrated, the controller 85 includes a frequency sweeper circuit portion 90 cooperating with the microwave signal source 84 to sweep the microwave radiation over a predetermined frequency range. In other words, the microwave generator, generally designated by numeral 71, is frequency agile in the illustrated embodiment.

For example, the microwave radiation may in the frequency range of about 2 GHz to 16 GHz, although 3 GHz is considered by some to be technically below the microwave frequency band. Based upon available frequency agile microwave generators as described below, the frequency may be swept or varied over the frequency range of 5.85 to 7 GHz, in a relatively short time, such as 0.1 seconds. Sweeping the frequency may also prevent electrostatic fields from being generated in the integrated circuit die 76, which may otherwise damage the die.

In other embodiments, a single frequency microwave source may be used; however, the varying frequency microwave radiation is believed by Applicant, without wishing to be bound thereto, to provide enhanced uniformity of the conversion of the encapsulating material to loosened particles as described in greater detail below and without damaging the die 76.

For example, the apparatus 70 may be based upon a microwave curing oven offered by Lambda Technologies of Morrisville, N.C. under the model designations MicroCure 5100 and MicroCure 2100. The technology for varying the frequency of the microwave radiation is described in further detail in U.S. Pat. Nos. 5,321,222 and 5,521,360 the entire disclosures of which are incorporated herein by reference.

In the apparatus 70 of the present invention, the microwave radiation is at a significantly higher intensity at the encapsulant 80 to thereby break the polymer bonds in the resin, as opposed to heating the encapsulant to cure the encapsulant in the Lambda Technologies' curing ovens. The microwave curing ovens offered by Lambda Technologies are also relatively large, since they are intended to cure relatively large numbers of integrated circuits at one time. The apparatus 70 of the present invention would typically be needed to decapsulate only several integrated circuit packages 72 in a day. Accordingly, the size of the chamber 73 of the apparatus 70 need only accommodate a single package for most applications. For example, the interior volume of the chamber 73 may typically be about one cubic foot. Of course, in other applications, multiple integrated circuit packages could be decapsulated at one time, as will be readily appreciated by those skilled in the art.

At Block 28, the temperature of the integrated circuit package 72 is sensed while it is subjected to the microwave radiation. The temperature may be sensed by a sensor 93 associated with the support 94 as shown in the illustrated embodiment. Alternately, the temperature may be sensed by coupling a sensor directly to the integrated circuit package 72. Optical pyrommetry may also be used to sense the temperature as will be readily appreciated by those skilled in the art.

If the temperature of the integrated circuit package 72, as determined at Block 30 becomes too high, for example, the power level of the microwave radiation is adjusted (Block 32) using the schematically illustrated power level adjust circuit portion 96 of the controller 85. For example, since most integrated circuit dies 76 include aluminum metallization layers, the temperature should be kept below the 660° C. melting temperature of aluminum. It may also be desirable to keep the temperature below about 350° C. to prevent other detrimental effects to the package 72 so as to permit later testing.

Applicant theorizes, without wishing to be bound thereto, that the microwave radiation directly breaks at least a portion of the polymer bonds of the resin. Of course heat is also generated, and the thermal energy may also serve to break some of the polymer bonds. Once these bonds are broken, the encapsulant 80 is converted to a mass of loosened particles resembling ash as will be readily appreciated by those skilled in the art.

At Block 34 the integrated circuit package is monitored, such as by visual inspection, to determine if the conversion is complete. If the conversion is not complete to the extent desired, the microwave radiation is continued. If the conversion of the encapsulant 80 into the loosened particles is complete, then the microwave radiation is stopped at Block 38. The conversion process may be relatively quick, especially as compared to oxygen plasma etching as in the prior art. For example, the conversion of the encapsulant 80 into loosened particles may take only several minutes to complete using the present invention.

Figure 3:
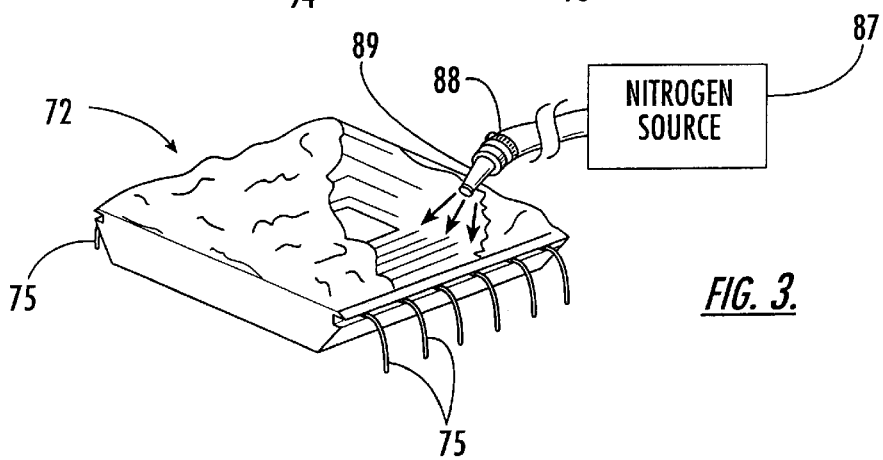
FIG. 3 is a perspective view and partial schematic block diagram illustrating removal of the loosened particles in accordance with one embodiment of the invention.
Figure 4:
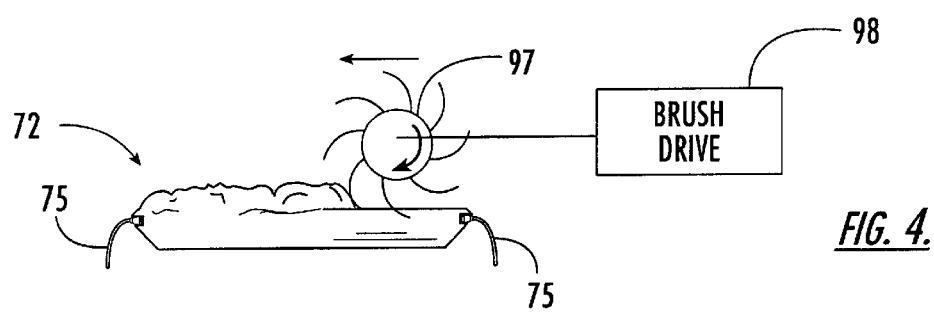
FIG. 4 is an end view and partial schematic block diagram illustrating removal of the loosened particles in accordance with another embodiment of the invention.

The loosened particles are removed from the integrated circuit package at Block 40. The particles may be removed in the chamber 73; however, it may be advantageous to first remove the package 72 from the chamber so that the loosened particles can be collected for disposal. Turning now briefly to FIGS. 3 and 4, two approaches for removing the loosened particles are shown. In FIG. 3, a nitrogen gas stream is directed to the integrated circuit package 72' to gently remove the loosened particles without damaging the underlying components. The nitrogen stream is delivered from the nitrogen source 87, through the tubing 88, and output from the illustrated nozzle 89. Of course, fluids other than nitrogen may be used for the removal. Fluids in the form of gasses may be preferred to liquids.

In FIG. 4, a rotating brush 97 is advanced adjacent the integrated circuit package 72" to thereby contact and dislodge the loosened particles. The brush 97 in illustrated embodiment is connected to a brush drive 99 which rotates the brush, and advances the brush along a predetermined path of travel. Of course, those of skill in the art will appreciate that manual brushing may also be readily used to remove the loosened particles. In addition, subjecting the integrated circuit package 72 to gentle vibration may also dislodge the loosened particles.

Figure 5:
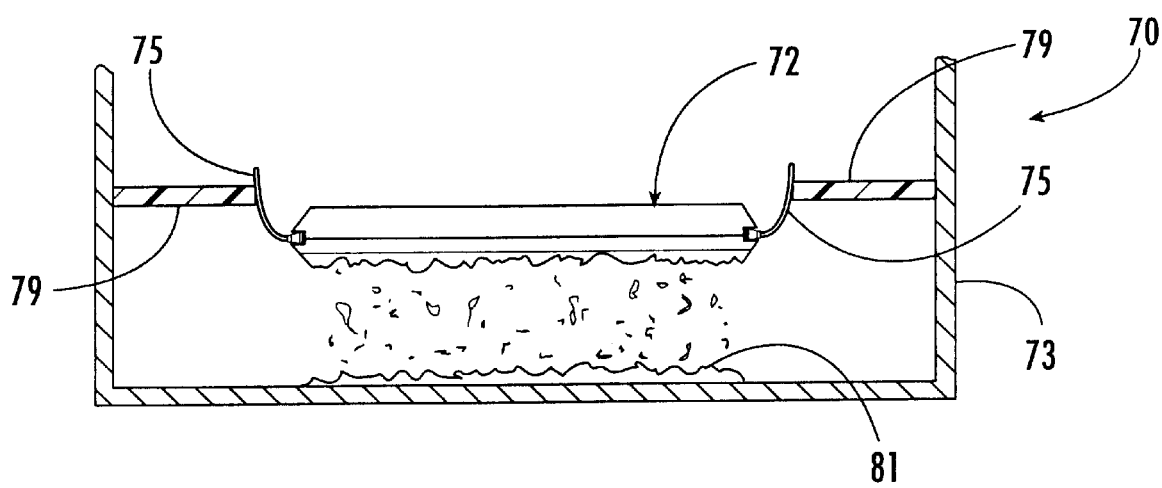
FIG. 5 is a side schematic view, partially in section, of another embodiment of the invention wherein the integrated circuit package is supported in an inverted position, and the removal of loosened particles is effected by gravity.

The loosened particles may be removed under the influence of gravity alone. For example, the integrated circuit package 72 could be oriented in an inverted position within the chamber 73 and the radiation directed upward to the package. As shown in FIG. 5, for example, the integrated circuit package 72 could be suspended in an inverted position within the chamber 73 by the schematically illustrated clamps 79 so that the loosened particles fall under the influence of gravity. The particles, once removed, would define a mass 81 at the bottom of the chamber. Other approaches to removing loosened particles are also contemplated by the present invention as will be readily appreciated by those skilled in the art.

Returning now again more particularly to the flow chart 20 of FIG. 1, and the apparatus 70 shown in FIG. 2, if the integrated circuit die 76 is exposed (Block 42), then subsequent testing or other examination can be performed. In the illustrated example, further examination is carried out for the purpose of failure analysis, although those of skill in the art will recognize that there are many other applications where decapsulating the integrated circuit package 72 is advantageous.

At Block 44, the integrated circuit die 76 may be visually examined using conventional microscopy to determine the cause of the failure. If the failure is determined as a result of the visual inspection at Block 46, then a report may be generated at Block 60. If no failure is determined, then the integrated circuit die may be electrically tested at Block 48 using convention testing techniques as will be readily appreciated by those skilled in the art. More particularly, the present invention also preserves the bond pads 78 of the integrated circuit die 76. Accordingly, another significant advantage of the present invention is that the electrical testing can be readily carried out by conventional probing of the contact pads 78 on the die 76. Other conventional wet etching decapsulating methods, for example, may destroy the bond pads 78, thereby rendering impossible or making difficult any subsequent electrical testing of the integrated circuit die 76, as will be readily appreciated by those skilled in the art.

If the cause of the failure is determined during the electrical testing, then the report of the failure may be generated at Block 60. If, however, the integrated circuit die 76 passes the electrical testing as determined at Block 50 or otherwise suggests that ionic contamination of the die may be the cause of the failure, then conventional chemical analysis tools may be used at Block 52 to determine whether there is any ionic contamination present at the outermost interface of the die. According to a significant advantage of the present invention, this interface is preserved by the "dry" removal process of the present invention. This is in contrast to conventional acid or "wet" etching techniques where the interface is removed. In addition, although the conventional oxygen plasma etching may be considered a dry process, it is a chemically energetic process which tends to remove any surface contamination from the integrated circuit die.

If ionic contamination at the interface as determined at Block 54, is determined to be the cause of the circuit failure, a report may be generated at Block 60. If the interface is not contaminated, then destructive physical analysis, as may typically include delayering of the die, may be performed at Block 58. If the failure is determined, the report is generated (Block 60). Of course, those of skill in the art will appreciate that the examination steps outlined above are only representative of the many variations of examinations that can be conducted for failure analysis. The steps may be performed in different orders, and certain steps are optional.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. Apparatus for decapsulating an integrated circuit package of a type comprising an encapsulant including a polymer resin, the apparatus comprising:

a microwave shielded chamber;

a support for supporting the integrated circuit package within said microwave shielded chamber;

a microwave generator coupled to said shielded microwave chamber for generating microwave radiation therein so as to subject the encapsulant of the integrated circuit package to microwave radiation to break polymer bonds in the polymer resin and convert the encapsulant to loosened particles, said microwave generator further comprising frequency varying means or varying a frequency of the microwave radiation over a predetermined frequency range;

means for removing loosened particles from the integrated circuit package, the loosened particle removing means comprising one of a rotating brush and means for directing a fluid stream toward the loosened particles.

2. An apparatus according to claim 1 further comprising temperature control means for maintaining the integrated circuit package below a predetermined temperature during the subjecting step.

3. An apparatus according to claim 2 wherein said temperature control means comprises a temperature sensor and power control means for controlling a power of said microwave generator responsive to said temperature sensor.

4. An apparatus according to claim 1 wherein said frequency varying means comprises means for varying the frequency over a range of about 5 GHz to 8 GHz.

5. An apparatus for decapsulating an integrated circuit package of a type comprising an encapsulant including a polymer resin, the apparatus comprising:

a chamber;

a support for supporting the integrated circuit package within said chamber;

a microwave generator coupled to said chamber for generating microwave radiation therein varying in frequency over a predetermined range so as to subject the encapsulant of the integrated circuit package to microwave radiation to break polymer bonds in the polymer resin and convert the encapsulant to loosened particles;

a temperature sensor cooperating with said microwave generator for maintaining the integrated circuit package below a predetermined temperature during the subjecting step;

a loosened particle remover for removing loosened particles from the integrated circuit package, the loosened particle remover comprising one of a rotating brush and a nozzle for directing a fluid stream toward the loosened particles.

6. An apparatus according to claim 5 wherein the predetermined frequency range is about 5 GHz to 8 GHz.

* * * * *